(12) United States Patent
Chen et al.

(10) Patent No.: US 11,950,071 B2
(45) Date of Patent: Apr. 2, 2024

(54) ACOUSTIC DEVICE

(71) Applicant: AAC Microtech (Changzhou) Co., Ltd., Changzhou (CN)

(72) Inventors: Weimin Chen, Shenzhen (CN); Kejia Liu, Shenzhen (CN); Yuheng Jiang, Shenzhen (CN)

(73) Assignee: AAC Microtech (Changzhou) Co., Ltd., Changzhou (CN)

( * ) Notice: Subject to any disclaimer, the term of this patent is extended or adjusted under 35 U.S.C. 154(b) by 160 days.

(21) Appl. No.: 17/826,194

(22) Filed: May 27, 2022

(65) Prior Publication Data
US 2023/0199393 A1    Jun. 22, 2023

(30) Foreign Application Priority Data
Dec. 16, 2021    (CN) .......................... 202123176049.7

(51) Int. Cl.
| | | |
|---|---|---|
| H04R 7/12 | (2006.01) | |
| H04R 7/20 | (2006.01) | |
| H04R 9/02 | (2006.01) | |
| H04R 9/04 | (2006.01) | |
| H05K 1/18 | (2006.01) | |

(52) U.S. Cl.
CPC .............. *H04R 7/127* (2013.01); *H04R 7/20* (2013.01); *H04R 9/025* (2013.01); *H04R 9/045* (2013.01); *H05K 1/189* (2013.01)

(58) Field of Classification Search
CPC .......... H04R 7/127; H04R 7/20; H04R 9/025; H04R 7/04; H04R 9/043; H04R 9/045; H04R 9/06; H05K 1/189
See application file for complete search history.

(56) References Cited

U.S. PATENT DOCUMENTS

| | | | |
|---|---|---|---|
| 2020/0045428 A1* | 2/2020 | Song ........................ | H04R 9/06 |
| 2020/0213761 A1* | 7/2020 | Xiao ........................ | H04R 7/04 |
| 2023/0031282 A1* | 2/2023 | Ren ......................... | H04R 9/06 |

\* cited by examiner

*Primary Examiner* — Tuan D Nguyen
(74) *Attorney, Agent, or Firm* — W&G Law Group

(57) ABSTRACT

The present invention provides an acoustic device including a frame, a vibration system and a magnetic system. The vibration system includes a diaphragm, a voice coil assembly, and a support assembly. The support assembly includes a flexible circuit board and a support membrane. The flexible circuit board includes a first fixing end secured to the frame, a second fixing end secured to the voice coil assembly, a connecting portion, and a soldering pad. The voice coil assembly includes a first voice coil and a second voice coil. The first voice coil includes a first leading wire. The first leading wire has a first extension part extending from a surface of the first voice coil, a second extension part bending and extending from the first extension part along an outer surface of the second voice coil, and a soldering part welding to the soldering pad.

8 Claims, 4 Drawing Sheets

ACOUSTIC DEVICE

FIELD OF THE PRESENT INVENTION

The present invention relates to electro-acoustic transducers, and more particularly, to an acoustic device used in electronic speaker box products.

DESCRIPTION OF RELATED ART

With the rapid development of wireless communication technologies, mobile phone and other consumer electronic products are widely used. Acoustic devices are also known as speakers or horns, and are often used in these products. Specifically, they are used in speaker boxes to convert audio signals into sound for playback. As customers' requirements for consumer electronic products increase, more requirements are given to acoustic devices.

In related art, the acoustic device usually includes a frame, a vibration system supported on the frame, and a magnetic circuit system having a magnetic gap. The magnetic system drives the vibration system to generate sounds. The vibration system includes a diaphragm fixed to the frame and a voice coil at least partially located in the magnetic gap. In order to improve a performance of the acoustic device and output a larger sound pressure level (SPL), a double voice coil can be used as a driver in the acoustic device, that is, an inner voice coil is disposed inside the conventional voice coil. In this way, when the acoustic device is working, the two voice coils work at the same time, providing a larger driving force to the diaphragm, which can effectively improve the performance of the acoustic device. However, there is a technical difficulty in the dual-voice coil speaker, which is the problem of how to arrange a leading wire of the inner voice coil.

Therefore, it is desired to provide a new acoustic device which can overcome the above problems.

SUMMARY

In view of the above, the embodiments of the present invention provide a new acoustic device with stable structure.

The present invention provides an acoustic device, including a frame, a vibration system and a magnetic system supported on the frame respectively. The vibration system includes a diaphragm, a voice coil assembly driving the diaphragm to generate sounds, and a support assembly connecting the frame and the voice coil assembly. The support assembly includes a flexible circuit board mounted on a side of the voice coil assembly away from the diaphragm and a support membrane mounted on a side of the flexible circuit board away from the frame. The flexible circuit board includes a first fixing end secured to the frame, a second fixing end secured to the voice coil assembly, a connecting portion connecting the first fixing end and the second fixing end, and a soldering pad extending from the connecting portion. The voice coil assembly includes a first voice coil with an annular shape and a second voice coil surrounding an outer periphery of the first voice coil. The first voice coil includes a first leading wire. The first leading wire includes a first extension part extending from a surface of the first voice coil closed to the diaphragm and extending out of an outer edge of the second voice coil, a second extension part bending and extending from the first extension part along an outer surface of the second voice coil, and a soldering part welding to the soldering pad.

As an improvement, the acoustic device is rectangular, and each side along a direction of a short axis of the voice coil assembly is provided with one support assembly, the first leading wire extending from a short axis of the first voice coil.

As an improvement, the diaphragm comprises a dome and a suspension connecting to the dome, the suspension comprising a flat portion attached to the dome, a suspension portion bending and extending around the flat portion, and a mounting portion extending outward from the suspension portion, an avoiding portion is disposed on the flat portion corresponding to a position of the first leading wire.

As an improvement, the avoiding portion passing through an upper surface and a lower surface of the flat portion.

As an improvement, the second voice coil comprises a second leading wire extending from a surface of the second voice coil away from the diaphragm, and the second leading wire is welded to the soldering pad.

As an improvement, the magnetic circuit system comprises a yoke, a main magnet mounted on the yoke, and a first auxiliary magnet spaced apart from the main magnet for forming a first magnetic gap, and second auxiliary magnet spaced apart from the first auxiliary magnet for forming a second magnetic gap, at least a part of the first voice coil located in the first magnetic gap, and at least a part of the second voice coil located in the second magnetic gap.

As an improvement, the first auxiliary magnet is a hollow annular structure.

As an improvement, the acoustic device further comprises a conductive member embedded in the frame, and the conductive member is connected to the soldering pad of the flexible circuit board.

BRIEF DESCRIPTION OF THE DRAWINGS

Many aspects of the exemplary embodiments can be better understood with reference to the following drawing. The components in the drawing are not necessarily drawn to scale, the emphasis instead being placed upon clearly illustrating the principles of the present invention.

Moreover, in the drawings, like reference numerals designate corresponding parts throughout the several views.

DETAILED DESCRIPTION OF THE EXEMPLARY EMBODIMENTS

The present invention will hereinafter be described in detail with reference to exemplary embodiments. To make the technical problems to be solved, technical solutions and beneficial effects of the present invention more apparent, the present invention is described in further detail together with the figures and the embodiments. It should be understood the specific embodiments described hereby is only to explain the disclosure, not intended to limit the disclosure.

Figure 1:
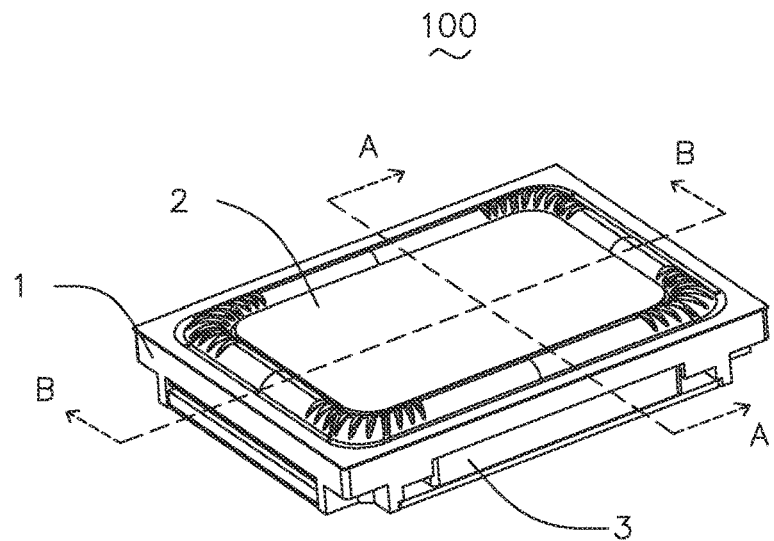
FIG. 1 is an illustrative isometric view of an acoustic device in accordance with the present invention.
Figure 2:
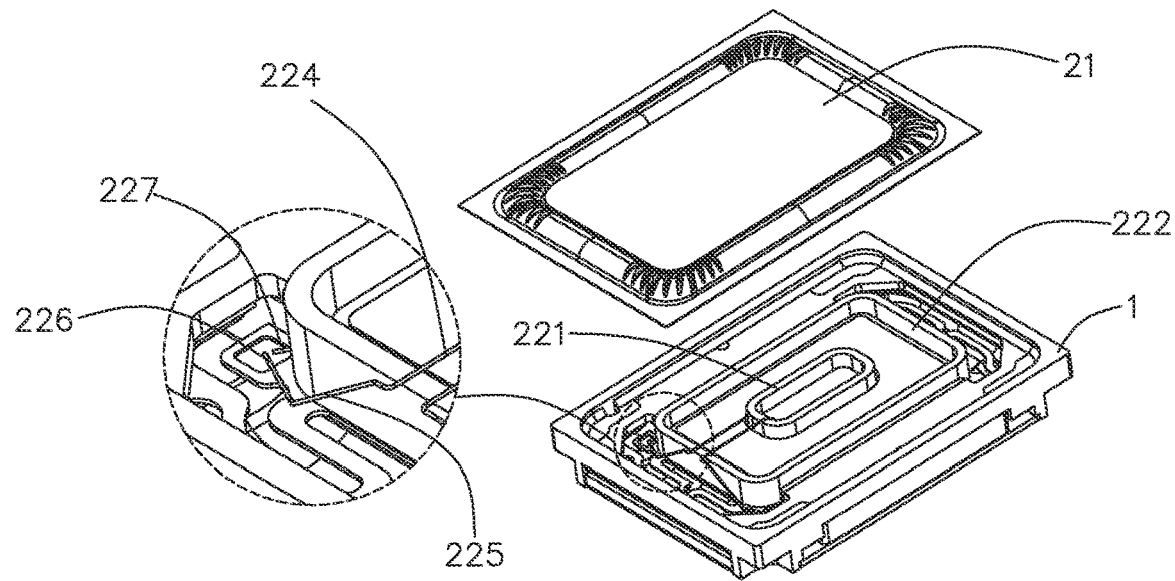
FIG. 2 is a partially exploded view of the acoustic device of FIG. 1.
Figure 3:
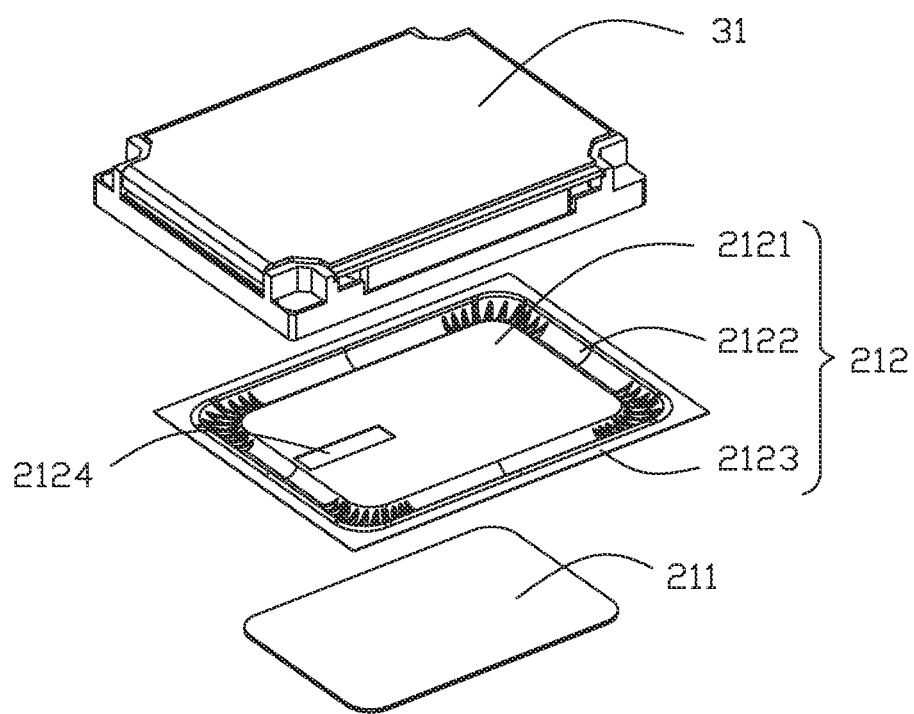
FIG. 3 is another partially exploded view of the acoustic device of FIG. 1.
Figure 4:
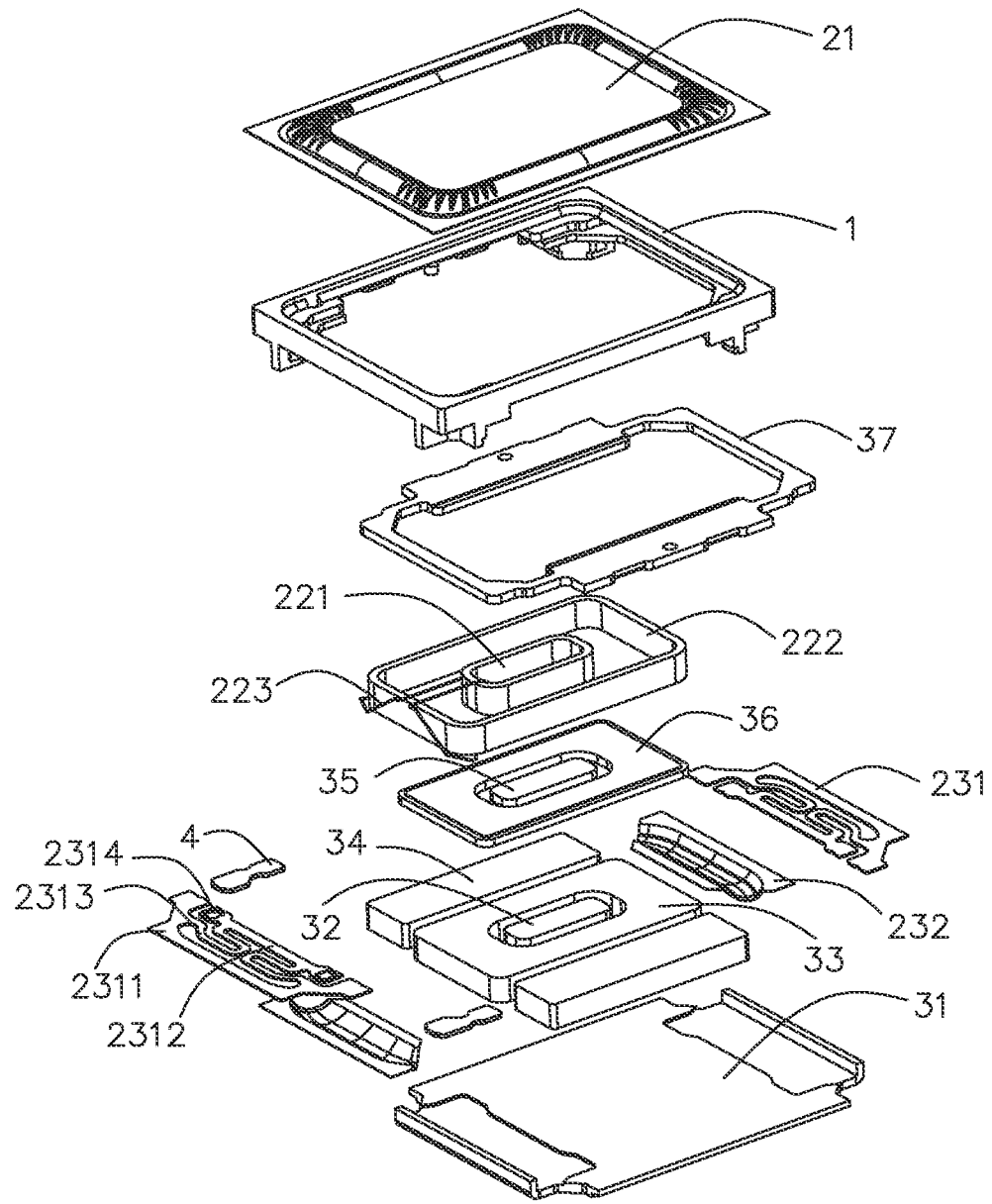
FIG. 4 is an exploded view of the acoustic device of FIG. 1.
Figure 5:
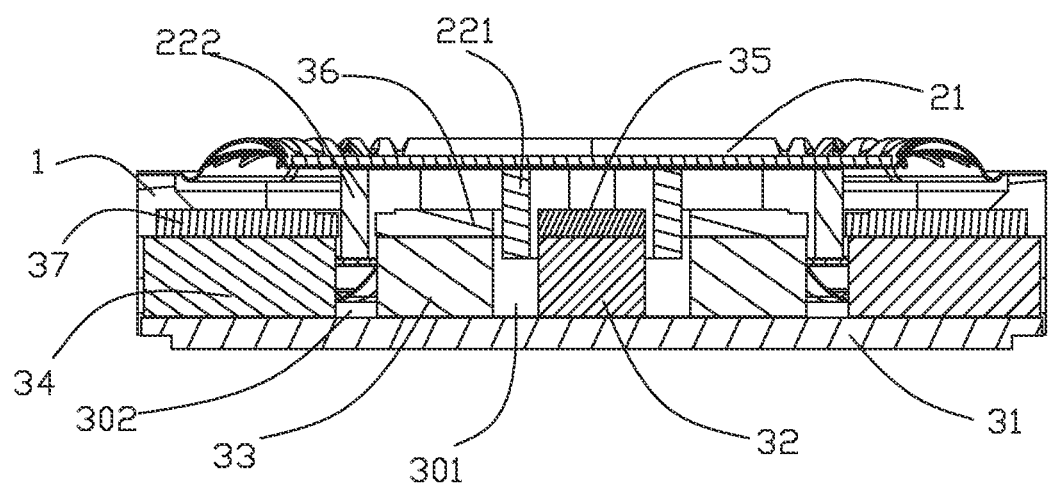
FIG. 5 is an illustrative cross-sectional view of the acoustic device taken along line A-A of FIG. 1.
Figure 6:
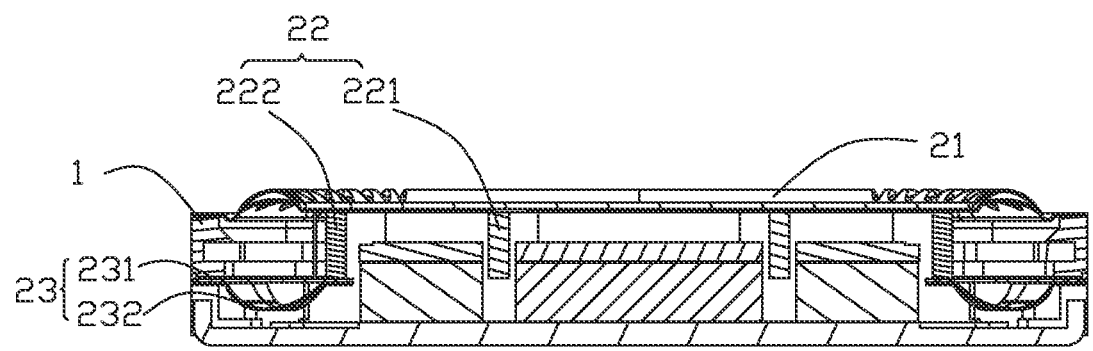
FIG. 6 is an illustrative cross-sectional view of the acoustic device taken along line B-B of FIG. 1.

Referring to the FIGS. 1-6, the present invention provides one embodiment of an acoustic device 100. The acoustic device 100 includes a frame 1, a vibration system 2, a magnetic circuit system 3 supported on the frame 1, and a conductive member 4 embedded in the frame 1. The vibration system 2 and the magnetic circuit system 3 are supported on the frame 1 respectively, and the magnetic circuit system 3 drives the vibration system 2 to generate sounds. The frame 1 is a rectangular annular hollow structure.

The vibration system 2 includes a diaphragm 21, a voice coil assembly 22 driving the diaphragm 21 to generate sounds, and a support assembly 23 connecting the frame 1 and the voice coil assembly 22.

The diaphragm 21 comprises a dome 211 and a suspension 212 connecting to the dome 211. The suspension 212 comprises a flat portion 2121 attached to the dome 211, a suspension portion 2122 bending and extending around the flat portion 2121, and a mounting portion 2123 extending outward from the suspension portion 2122. The mounting portion 2123 is fixed and connected to the frame 1.

The voice coil assembly 22 includes a first voice coil 221 with an annular shape and a second voice coil 222 surrounding an outer periphery of the first voice coil 221. The first voice coil 221 includes a first leading wire 223. The first leading wire 223 includes a first extension part 224 extending from a surface of the first voice 221 closed to the diaphragm 21 and extending out of an outer edge of the second voice coil 222, a second extension part 225 bending and extending from the first extension part 224 along an outer surface of the second voice coil 222, and a soldering part 226 extending from the second extension part 225. The first leading wire 223 abuts against and is supported on a surface of the second voice coil 222 proximal to the diaphragm 21. The second voice coil 222 includes a second leading wire 227 extending from a surface of the second voice coil 222 distal to the diaphragm 21.

An avoiding portion 2124 is disposed on the flat portion 2121 of the suspension 212 of the diaphragm 21 corresponding to a position of the first leading wire 223. The avoiding portion 2124 passes through an upper surface and a lower surface of the flat portion 2121. Optionally, in other embodiments, the avoiding portion 2124 can also be a concave structure formed from a recession on the lower surface of the flat portion 2121, and may not penetrate through the upper surface of the flat portion 2121.

The support assembly 23 includes a flexible circuit board 231 mounted on a side of the voice coil assembly 22 away from the diaphragm 21 and a support membrane 232 mounted on a side of the flexible circuit board 231 away from the frame 1. The flexible circuit board 231 includes a first fixing end 2311 secured to the frame 1, a second fixing end 2312 secured to the voice coil assembly 22, a connecting portion 2313 connecting the first fixing end 2311 and the second fixing end 2312, and a soldering pad 2314 extending from the connecting portion 2313. Both the first leading wire 223 and the second leading wire 227 are welded to the soldering pad 2314. In detail, the soldering part 226 of the first leading wire 223 is welded to the soldering pad 2314. The conductive member 4 is connected to the soldering pad 2314 of the flexible circuit board 231 to provide electrical connection for the first voice coil 221 and the second voice coil 222. In present embodiment, the number of the soldering pads 2314 is two, and the number of the conductive members 4 is also two, and each soldering pad 2314 is connected to the corresponding conductive member 4.

The acoustic device 100 is rectangular, and each side along a direction of a short axis of the voice coil assembly 22 is provided with one support assembly 23, and the first leading wire 223 extends from a short axis of the first voice coil 221 and is fixedly welded to the flexible circuit board 231 located on the short axis.

Optionally, the support assembly 23 can be also arranged along a long axis of the voice coil assembly 22, but in this way, an overall length of the first leading wire of the first voice coil will be elongated, and a stability of a leading fixing structure will be worse than the structure that the support assembly disposed on the short axis of the voice coil assembly.

The magnetic circuit system 3 comprises a yoke 31, a main magnet 32 mounted on the yoke 31, and a first auxiliary magnet 33 spaced apart from the main magnet 32 for forming a first magnetic gap 301, and second auxiliary magnet 34 spaced apart from the first auxiliary magnet 33 for forming a second magnetic gap 302, a main pole plate 35 covered on the main magnet 32, a first auxiliary pole plate 36 covered on the first auxiliary magnet 33, and a second auxiliary pole plate 37 covered on the second auxiliary magnet 34. At least a part of the first voice coil 221 is located in the first magnetic gap 301, and at least a part of the second voice coil 222 is located in the second magnetic gap 302. A part of the second auxiliary pole plate 37 is embedded in the frame 1. The first auxiliary magnet 33 is a hollow annular structure, and the first auxiliary pole plate 36 is also a hollow annular structure.

The first voice coil 221 of the present invention, that is, an inner voice coil of the present invention, leading the first leading wire 223 across an upper surface (the surface close to the diaphragm 21) of an outer voice coil (the second voice coil), to an outer peripheral surface of the outer voice coil, and then bending and extending the first leading wire 223 to the flexible circuit board 231 and is fixedly connected with the soldering pad 2314 of the flexible circuit board 231. The second voice coil 222, that is, the outer voice coil, directly leading the second leading wire 227 from a lower surface (the surface away from the diaphragm 21) of the outer voice coil (second voice coil), to the flexible circuit board 231 and is fixedly connected with the soldering pad 2314 of the flexible circuit board 231. In this way, the leading wires of the inner and outer voice coils do not interfere with each other, and each can be stably connected to the soldering pad, which improves the stability of the acoustic device. And the leading wires are not easy to fall off when the inner and outer voice coils vibrate.

Comparing with the related art, in present invention, the acoustic device includes a frame, a vibration system and a magnetic system supported on the frame respectively. The vibration system includes a diaphragm, a voice coil assembly driving the diaphragm to generate sounds, and a support assembly connecting the frame and the voice coil assembly. The support assembly includes a flexible circuit board mounted on a side of the voice coil assembly away from the diaphragm and a support membrane mounted on a side of the flexible circuit board away from the frame. The flexible circuit board includes a first fixing end secured to the frame, a second fixing end secured to the voice coil assembly, a connecting portion connecting the first fixing end and the second fixing end, and a soldering pad extending from the connecting portion. The voice coil assembly includes a first voice coil with an annular shape and a second voice coil surrounding an outer periphery of the first voice coil. The first voice coil includes a first leading wire. The first leading wire includes a first extension part extending from a surface of the first voice coil closed to the diaphragm and extending out of an outer edge of the second voice coil, a second extension part bending and extending from the first extension part along an outer surface of the second voice coil, and a soldering part welding to the soldering pad. In present invention, leading the leading wire of the inner voice coil to outside of the outer voice coil across the surface close to the diaphragm, and then bending and leading the leading wire to the soldering pad. In this way, the inner voice coil can be firmly fixed even if the leading wire is long, and it is not easy to fall off during the vibration of the voice coils.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. An acoustic device, comprising:
    a frame;
    a vibration system supported on the frame, the vibration system comprising:
        a diaphragm;
        a voice coil assembly driving the diaphragm to generate sounds, the voice coil assembly comprising:
            a first voice coil with an annular shape, the first voice coil comprising a first leading wire;
            a second voice coil surrounding an outer periphery of the first voice coil;
        a support assembly connecting the frame and the voice coil assembly, the support assembly comprising:
            a flexible circuit board mounted on a side of the voice coil assembly away from the diaphragm, the flexible circuit board comprising:
                a first fixing end secured to the frame;
                a second fixing end secured to the voice coil assembly,
                a connecting portion connecting the first fixing end and the second fixing end, and
                a soldering pad extending from the connecting portion;
            a support membrane mounted on a side of the flexible circuit board away from the frame;
    a magnetic system supported on the frame;
    wherein the first leading wire comprises a first extension part extending from a surface of the first voice coil closed to the diaphragm and extending out of an outer edge of the second voice coil, a second extension part bending and extending from the first extension part along an outer surface of the second voice coil, and a soldering part welding to the soldering pad.

2. The acoustic device as described in claim 1, wherein the acoustic device is rectangular, and each side along a direction of a short axis of the voice coil assembly is provided with one support assembly, the first leading wire extending from a short axis of the first voice coil.

3. The acoustic device as described in claim 1, wherein the diaphragm comprises a dome and a suspension connecting to the dome, the suspension comprising a flat portion attached to the dome, a suspension portion bending and extending around the flat portion, and a mounting portion extending outward from the suspension portion, an avoiding portion is disposed on the flat portion corresponding to a position of the first leading wire.

4. The acoustic device as described in claim 3, wherein the avoiding portion passing through an upper surface and a lower surface of the flat portion.

5. The acoustic device as described in claim 1, wherein the second voice coil comprises a second leading wire extending from a surface of the second voice coil away from the diaphragm, and the second leading wire is welded to the soldering pad.

6. The acoustic device as described in claim 4, wherein the magnetic circuit system comprises a yoke, a main magnet mounted on the yoke, a first auxiliary magnet spaced apart from the main magnet for forming a first magnetic gap, and second auxiliary magnet spaced apart from the first auxiliary magnet for forming a second magnetic gap, at least a part of the first voice coil located in the first magnetic gap, and at least a part of the second voice coil located in the second magnetic gap.

7. The acoustic device as described in claim 6, wherein the first auxiliary magnet is a hollow annular structure.

8. The acoustic device as described in claim 1, wherein the acoustic device further comprises a conductive member embedded in the frame, and the conductive member is connected to the soldering pad of the flexible circuit board.

* * * * *